(12) United States Patent
Gardner

(10) Patent No.: US 6,768,507 B2
(45) Date of Patent: Jul. 27, 2004

(54) LED PRINT HEAD FOR ELECTROPHOTOGRAPHIC PRINTER

(75) Inventor: Keith Gardner, Cambridge (GB)

(73) Assignee: The Technology Partnership PLC (GB)

(*) Notice: Subject to any disclaimer, the term of this patent is extended or adjusted under 35 U.S.C. 154(b) by 170 days.

(21) Appl. No.: 10/102,158

(22) Filed: Mar. 20, 2002

(65) Prior Publication Data

US 2002/0135665 A1 Sep. 26, 2002

(30) Foreign Application Priority Data

Mar. 20, 2001 (EP) .............................................. 01302564

(51) Int. Cl.$^7$ ................................................. B41J 2/45
(52) U.S. Cl. ....................................................... 347/238
(58) Field of Search ................................. 347/238, 239, 347/233, 225, 130, 129, 112, 247, 256; 359/362, 363, 641, 653, 654

(56) References Cited

U.S. PATENT DOCUMENTS 6,614,534 B1 * 9/2003 Marcus et al.

* cited by examiner

Primary Examiner—Raquel Yvette Gordon
(74) Attorney, Agent, or Firm—Williams, Morgan & Amerson

(57) ABSTRACT

A light-emitting diode (LED) print head has a linear array of LEDs and device drivers for delivering current to each LED individually. An imaging lens system to create a real image of the LED array is provided in the form of a plurality of gradient index lenses and the LEDs each have emission cones closely matched to the numerical aperture of the gradient index imaging lenses.

37 Claims, 5 Drawing Sheets

LED PRINT HEAD FOR ELECTROPHOTOGRAPHIC PRINTER

BACKGROUND OF THE INVENTION

1. Field of the Invention

The present invention relates to LED print heads for electrophotographic printers and, more particularly, to a print head in which the use of light generated from an LED array is maximized. Specifically, the invention relates to an improvement in the light generated from an LED array with a so-called "GRIN" (Gradient INdex) imaging lens as conventionally used in electrophotographic printers.

2. Description of the Related Art

Electrophotography is a well-known method of digital printing. In this process, a metal drum coated with a photoconductive material is employed. The photoconductor has the property that it is an insulator when no light falls on it, but when exposed to light, the material becomes conducting. In use, a surface charge is produced on the photoconductive material by, for example, placing a wire held at a high potential near the surface of the drum. By the action of light falling on the drum, parts of the surface of the drum can be discharged. The mechanism for the discharge is that, as a result of the light falling on the photoconductive material, the illuminated regions, which become conducting, allow the charge to leak away to the layer below the photoconductor which is typically held at earth potential. As a result of this process, a so-called latent image is created on the drum in the unexposed areas. Charged toner particles brought into the vicinity of the latent image are attracted to the latent image by electrostatic action. This results in a real image being created. This real image can then be transferred to a substrate, such as paper, by bringing the substrate into contact with the toned image.

The process described above is well-known in the literature and more detailed descriptions can be found in Schaffert, Electrophotography, Enlarged and Revised Edition, London, 1975, for example.

The latent image referred to above can be generated by a variety of optical means, such as a scanned laser, a liquid crystal light valve with a conventional light source, or an array of light-emitting diodes. Methods employing arrays of light emitting diodes (LEDs) are particularly attractive for high-speed applications where the data rate is a significant consideration, for wide imaging arrays where it would be impractical to use scanned lasers or where a particularly compact arrangement is required. In addition, since LED arrays are solid state, they offer some mechanical advantages over scanned lasers.

One of the constraints when considering conventional LEDs as a means of creating a latent image on a photoconductor for electrophotographic imaging is that the light emitted by the LED is essentially Lambertian (i.e., it is emitted into $2\pi$ steradians). Using the conventional imaging means (a GRIN lens array), it is only possible to collect a small portion of the emitted light and image it onto the photoconductor. A GRIN lens array consists of a row or rows of gradient index lenses. One particular type of array is a SELFOC® array which is a unique type of imaging device supplied by NSG in Japan and in which the rays of light passing through the lens follow sinusoidal paths from the front surface to the back surface of the lens. Typically, two rows of graded index lenses will be used with the two rows offset from each other by half the diameter of the lens (as in a hexagonal close packed structure). In contrast to a conventional lens, which relies on the curvature of its faces to refract and hence focus light, a gradient index lens is a rod of glass in which the refractive index varies according to the radial distance from the longitudinal axis of the rod. In a conventional lens, the image created by the lens is inverted. This means that in order to image an array of light-emitting diodes onto a photoconductor, it is necessary to have one imaging lens aligned with the axis of each light-emitting diode. However, a gradient index lens does not invert the image with respect to the object. It is, therefore, not a requirement to have a one-to-one match between each of the light-emitting diodes and the lens, since the image produced by one lens lines up exactly with that of another lens.

As with any lens, there needs to be a defined separation between the source and the imaging lens. For a conventional LED, with a Lambertian emission profile, this separation means that, typically, the amount collected by a SELFOC® array is around 3%. As a result of this low efficiency, most of the light generated is wasted. For high-speed applications, in particular, this inefficiency also means that unwanted heat is generated in the LEDs and the drive circuitry.

The present invention solves, or at least reduces, some or all of the aforementioned problems.

SUMMARY OF THE INVENTION

According to the present invention, there is provided a light-emitting diode (LED) print head, comprising a linear array of LEDs, a means of delivering current to each LED individually, and an imaging lens system to create a real image of the LED array, the image lens system including a plurality of gradient index lenses, characterized in that the LEDs each have emission cones closely matched to the numerical aperture of the gradient index imaging lenses. Preferably, this is achieved by the use of resonant cavity light-emitting diodes (RCLEDs) as the LEDs. The numerical aperture NA is conventionally defined as 1/f where f is the f-number of the lens as quoted in the manufacturer's datasheets. The means of delivering the current to each individual light-emitting diode is preferably programmable through software to allow reconfiguration of the method of driving the print head. The data is preferably delivered to the print head via an optical fiber interface which has the advantages of noise immunity and bandwidth increase. Data is provided to drive electronics used to control the intensity or pulse length of printing pulses and to initiate firing of the LEDs in the array at the appropriate times. Preferably, calibration data is delivered to the print head via an optical fiber interface. This avoids the need to store the calibration data locally at the print head. The data to control the brightness of the light-emitting diodes are preferably delivered via an optical fiber interface to compensate for changes in the print speed.

Although there are a variety of methods of controlling the emission angle of LEDs to be less than $2\pi$ steradians, including attaching a microlens to each light-emitting diode, many of these are not particularly efficient. However, one advantageous method of controlling the emission angle is to use resonant cavity light-emitting diode (RCLED) technology. In this technology, an active light-emitting area is sandwiched between two mirrors that form a Fabry Perot resonator. The Fabry Perot resonator is designed such that the emission from the active layer lies within the pass band of the resonator. In detail, a number of layers of semiconductor material are deposited on a gallium arsenide substrate by metal-organic vapor phase epitaxy (MOVPE) to form a first Bragg reflector. Typically, these incorporate N-type doping. Next, the light-emitting layer is deposited typically in the form of gallium indium phosphide quantum wells with aluminum gallium indium phosphide barriers. This active quantum well layer is designed to have an optical thickness of one wavelength. A second Bragg structure is then deposited onto the quantum well layer, but this time with a P-type of doping, so that a P-N junction is formed between the two mirrors. A highly doped layer of gallium arsenide will typically be deposited onto the top of the structure to allow electrical contact to be formed.

The degree to which the emission profile is modified from being Lambertian, which would be the case without the Bragg mirrors, towards a pencil beam is a function of the reflectivity of the Bragg mirrors and the degree of detuning between the Fabry Perot resonance and the center of the quantum well emission. By selecting the correct reflectivity for the Bragg reflectors and the appropriate level of detuning, the emission profile for the LED can be matched to the collection aperture of the GRIN imaging lens.

The modification of the emission profile is controlled by the MOVPE deposition process on the wafer. Individual LEDs can be created on the wafer by using photolithography and etching to isolate individual light-emitting diodes from their neighbors. The deposition of insulating layers and metallization are used to produce the electrical contacts to the LED.

By utilizing this new LED technology, it is possible to achieve an improvement of more than 20 times in the useful light generated from an LED when used with a SELFOC® imaging lens. This improvement is illustrated in the graphs in FIGS. 6 and 7. By way of example, if we consider SELFOC® array type SLA 12 produced by NSG, then the distance from the light source to the input side of the lens array is 7.89 mm. Each lens in the array has a restricted view angle. In the case of SLA 12, this is 23.34 degrees (full angle). Therefore, any light that is emitted in a cone angle greater than this will not be collected by the SELFOC® at all. In actual fact, the situation is slightly worse than this in that since there are only two rows of lenses not all of the light that is emitted into this cone angle will be collected. In order to ensure that all of the emitted light is collected, the emitted cone angle should be less than 15.8 degrees full angle.

BRIEF DESCRIPTION OF THE DRAWINGS

The invention may be understood by reference to the following description taken in conjunction with the accompanying drawings, in which like reference numerals identify like elements, and in which.

Figure 1:
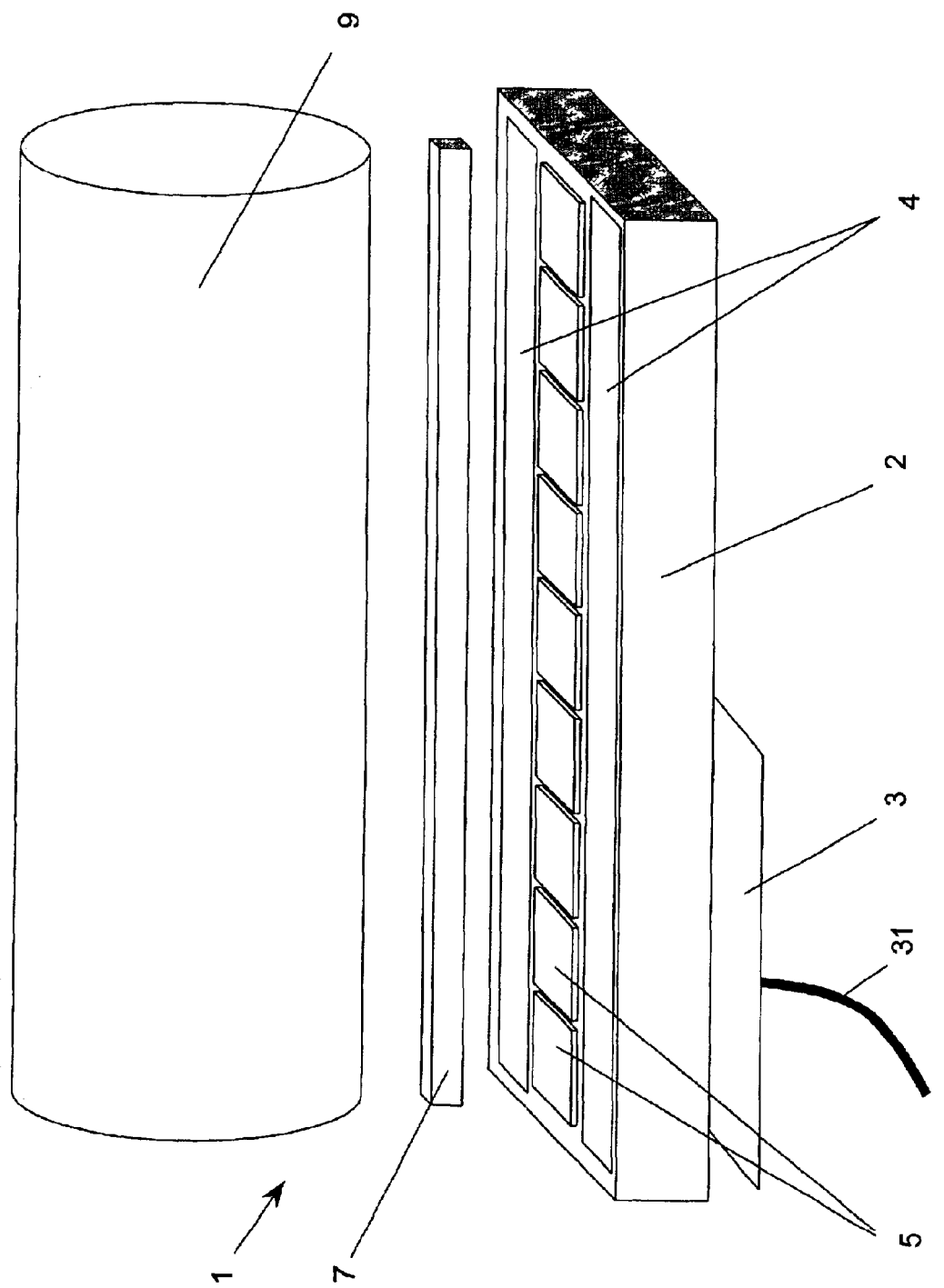
FIG. 1 illustrates part of the print head in an exploded perspective view.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
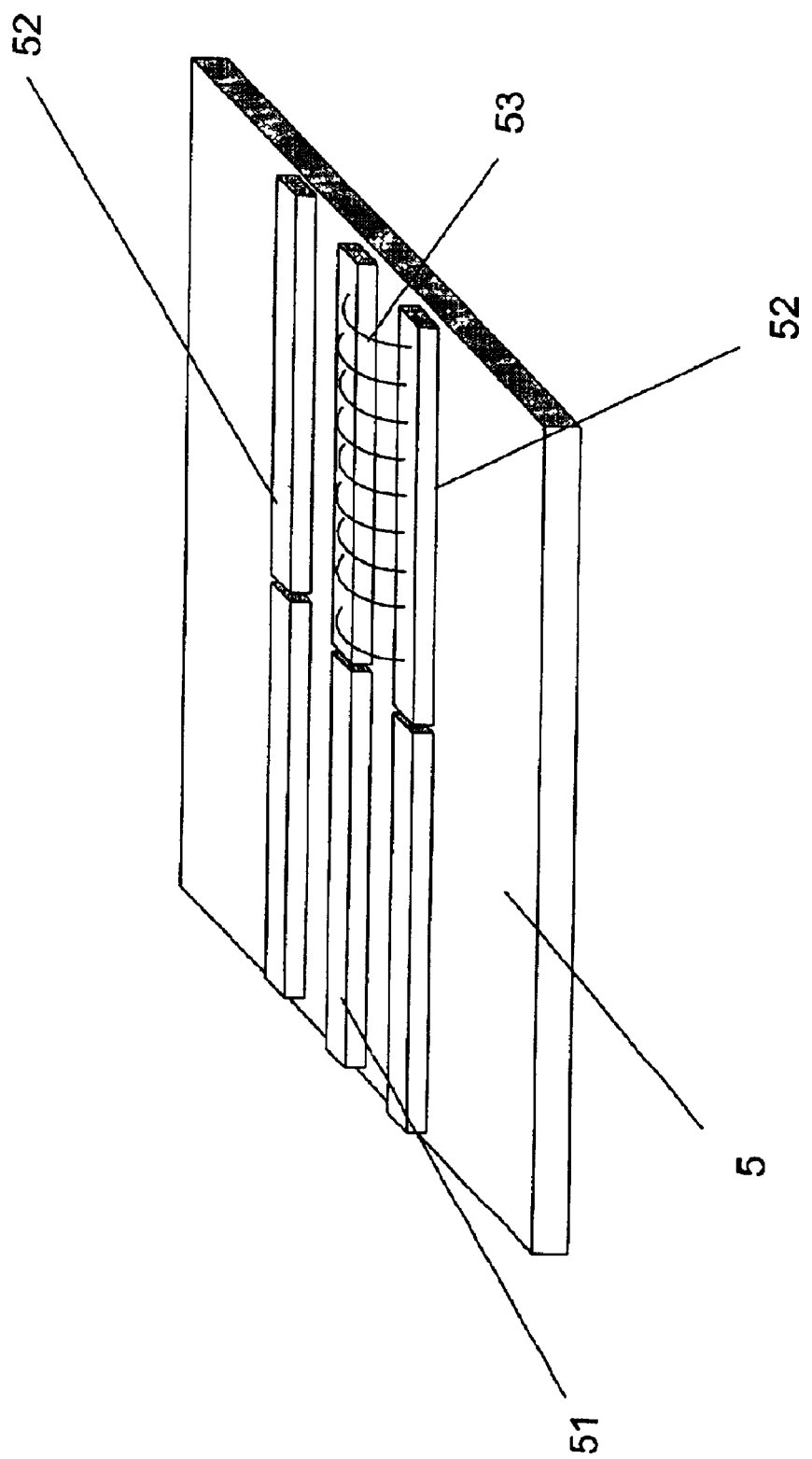
FIG. 2 shows details of a ceramic tile on which LED components are mounted.
Figure 3:
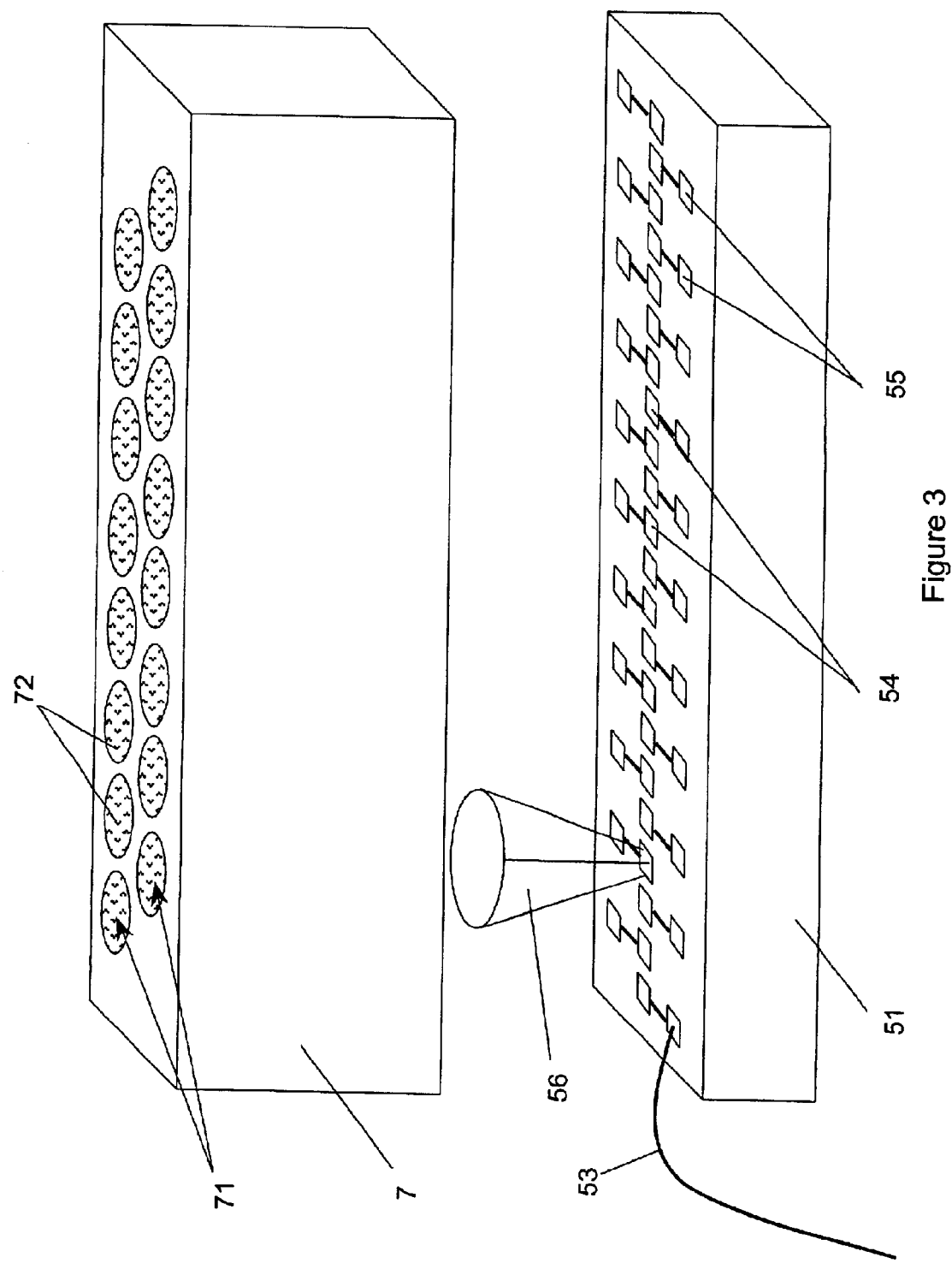
FIG. 3 shows a perspective view of LED components and a GRIN imaging lens array.

FIG. 1 is diagrammatic exploded perspective view of a print head 1 showing five key components, shown in more detail in FIGS. 2 and 3. Supporting the rest of the components is a hollow support structure 2 which also acts as a heat exchanger to dissipate heat from the print head 1. The support structure 2 is formed in such a way that either a gaseous coolant, such as air, or a liquid coolant, such as water, can be flowed through the structure to control the temperature. The required inlets and outlets are not shown, but may be located as suitable for the particular print head configuration. A fiber optic interface board 3 accepts data from a separate data station (not shown) via one or more fiber optic cables 31 and decodes this data. The data can include compensation data, to control the relative intensity of the individual light-emitting diodes (LEDs) 54 (see FIG. 3) with respect to all other LEDs and brightness control data, to vary the brightness of all of the LEDs in response to changing print speed requirements, together with the signal data that will result in the formation of the latent image on the printer's photoconductor 9 (shown diagrammatically). At least one, two in this example, data distribution circuit boards 4 are provided to relay the decoded data to the local drive circuits 52 (see FIG. 2) mounted on ceramic tiles 5. A SELFOC® lens array 7 images the light from the LEDs 54 onto the photoconductor drum 9.

In FIG. 2, details of the ceramic tile 5 that carries the LED chips 51 and the associated driver chips 52 can be seen. The driver chips 52 are arranged such that each driver chip has an equivalent number of drivers to the individual LEDs on the LED chip 51 and connections between them are via individual wire bonds 53. For simplicity, although plural LED chips 51 and corresponding pairs of driver chips 52 (one on each side of the respective LED chip 51) are shown, only one set of wire bond connections 53 is shown.

A portion of one of the LED chips 51 together with a section of the SELFOC® array 7 is shown in FIG. 3. Each LED 54 has a contact pad 55 which connects to a corresponding circuit on the driver chip 52 via an associated wire bond 53 (only one of which is shown in FIG. 3 for clarity) and the general shape of the light emission profile 56 is shown as is the SELFOC® array 7 with the individual lenses 71, the upper (as shown in FIG. 3) faces 72 of which pass the light to the photoconductor being shown. It can be seen how the emission profile of the RCLEDs matches the lenses 71.

Figure 4:
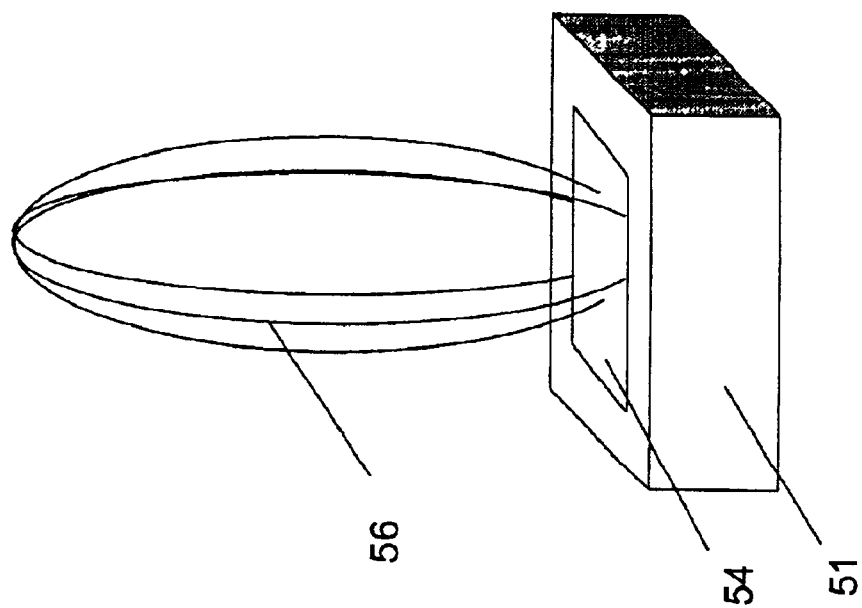
FIG. 4 illustrates the improvement in useful light generated from an RCLED array used with a GRIN imaging lens array.
Figure 5:
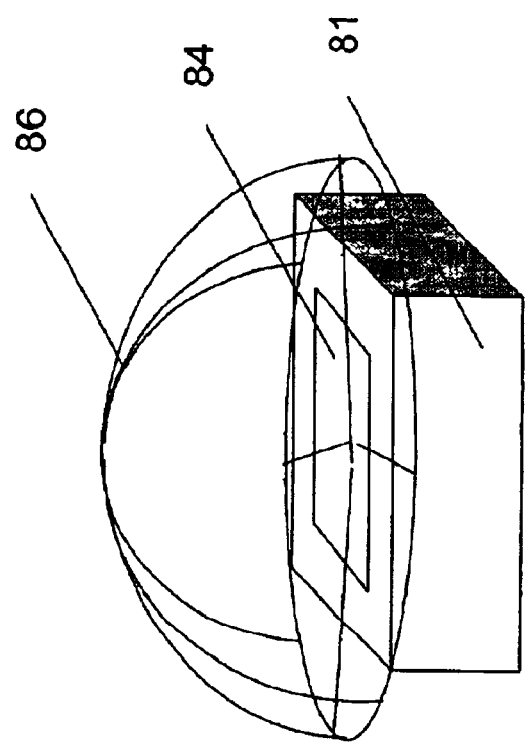
FIG. 5 illustrates, for comparison purposes, the emission of light from a conventional LED.

In FIGS. 4 and 5 there is shown the details of the difference between the light emission from a resonant cavity light-emitting diode (RCLED) 54 (FIG. 4) compared to that of a conventional surface emitting LED 84 (shown on a chip 81 in FIG. 5), the emission profiles being shown at 56 and 86, respectively.

Figure 6:
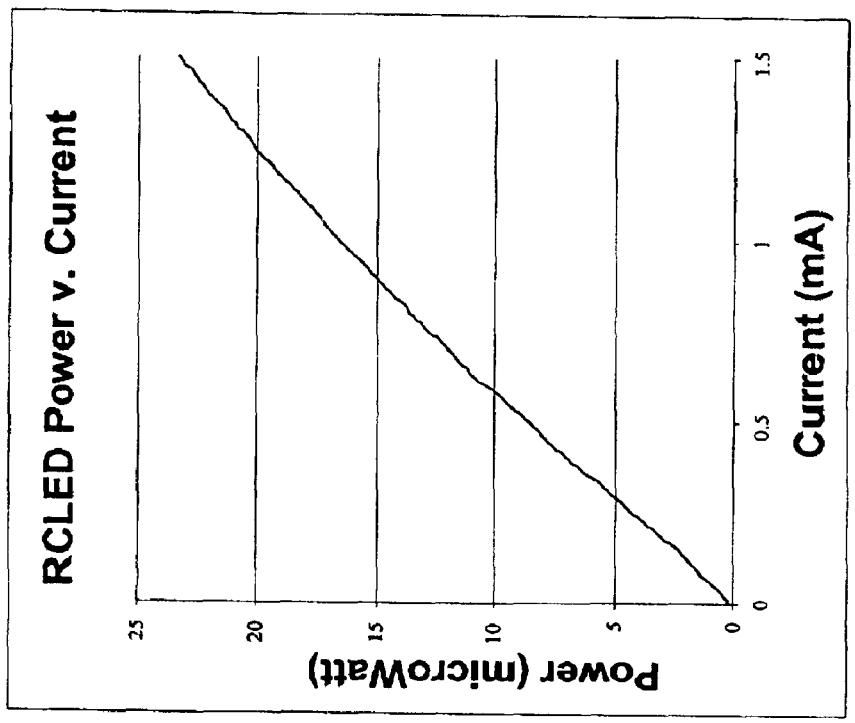
FIGS. 6 and 7 illustrate the improvement in power that can be achieved using RCLEDs in one particular print head embodying the present invention.
Figure 7:
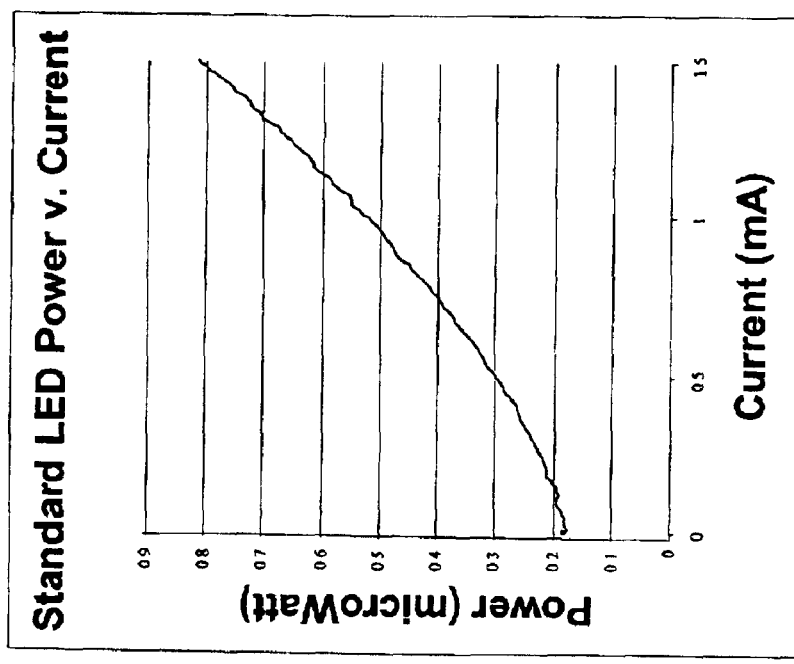

FIGS. 6 and 7 illustrate the improvement in power that can be achieved using RCLEDs in the print head of the invention.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A light emitting diode (LED) print head, comprising a linear array of LEDs, a means of delivering current to each LED individually, and an imaging lens system to create a real image of the LED array, the image lens system including a plurality of gradient index lenses, characterized in that the LEDs each have emission cones closely matched to the numerical aperture of the gradient index imaging lenses.

2. The print head according to claim 1, wherein the LED array comprises an array of resonant cavity light emitting diodes (RCLEDs).

3. The print head according to claim 2, further including programmable device drivers for delivering current to individual LEDs.

4. The print head according to claim 3, wherein said programmable device drivers are programmable through software to allow reconfiguration of the method of driving the print head.

5. The print head according to claim 4, wherein the programmable device drivers include means for controlling intensity or pulse length of printing pulses and/or to initiate firing of the LEDs in the array at appropriate times.

6. The print head according to claim 4, wherein the programmable device drivers include means for storing calibration data delivered to the print head.

7. The print head according to claim 4, wherein the programmable device drivers include means for controlling the brightness of the light emitting diodes to compensate for changes in print speed.

8. The print head according to claim 4, further including an optical fiber interface for delivering data to the print head.

9. The print head according to claim 3, wherein the programmable device drivers include means for controlling intensity or pulse length of printing pulses and/or to initiate firing of the LEDs in the array at appropriate times.

10. The print head according to claim 3, wherein the programmable device drivers include means for storing calibration data delivered to the print head.

11. The print head according to claim 3, wherein the programmable device drivers include means for controlling the brightness of the light emitting diodes to compensate for changes in print speed.

12. The print head according to claim 3, further including an optical fiber interface for delivering data to the print head.

13. The print head according to claim 2, further including an optical fiber interface for delivering data to the print head.

14. The print head according to claim 1, further including programmable device drivers for delivering current to individual LEDs.

15. The print head according to claim 14, wherein said programmable device drivers are programmable through software to allow reconfiguration of the method of driving the print head.

16. The print head according to claim 15, wherein the programmable device drivers include means for controlling intensity or pulse length of printing pulses and/or to initiate firing of the LEDs in the array at appropriate times.

17. The print head according to claim 15, wherein the programmable device drivers include means for storing calibration data delivered to the print head.

18. The print head according to claim 15, wherein the programmable device drivers include means for controlling the brightness of the light emitting diodes to compensate for changes in print speed.

19. The print head according to claim 15, further including an optical fiber interface for delivering data to the print head.

20. The print head according to claim 1, further including an optical fiber interface for delivering data to the print head.

21. A light-emitting diode (LED) print head, comprising a linear array of LEDs, a device driver circuit coupled to said array of LEDs and adapted to deliver current to each LED individually and an imaging lens system to create a real image of the LED array, the image lens system including a plurality of gradient index lenses, each LED having an emission cone closely matched to the numerical aperture of the gradient index imaging lenses.

22. The print head according to claim 21, wherein the LED array comprises an array of resonant cavity light emitting diodes (RCLEDs).

23. The print head according to claim 22, further including programmable device drivers for delivering current to individual LEDs.

24. The print head according to claim 23, wherein said programmable device drivers are programmable through software to allow reconfiguration of the method of driving the print head.

25. The print head according to claim 24, wherein the programmable device drivers include data storage locations to store calibration data delivered to the print head.

26. The print head according to claim 24, wherein the programmable device drivers include an electronic circuit and data adapted to control the brightness of the light-emitting diodes to compensate for changes in print speed.

27. The print head according to claim 23, wherein the programmable device drivers include an electronic control circuit to control at least one of the intensity and the pulse length of printing pulses.

28. The print head according to claim 23, wherein the programmable device drivers include an electronic control circuit to initiate firing of the LEDs in the array at appropriate times.

29. The print head according to claim 23, further including an optical fiber interface for delivering data to the print head.

30. The print head according to claim 22, further including an optical fiber interface for delivering data to the print head.

31. The print head according to claim 21, further including programmable device drivers for delivering current to individual LEDs.

32. The print head according to claim 31, wherein said programmable device drivers are programmable through software to allow reconfiguration of the method of driving the print head.

33. The print head according to claim 32, wherein the programmable device drivers include data storage locations to store calibration data delivered to the print head.

34. The print head according to claim 32, wherein the programmable device drivers include an electronic circuit and data adapted to control the brightness of the light-emitting diodes to compensate for changes in print speed.

35. The print head according to claim 31, wherein the programmable device drivers include an electronic control circuit to control at least one of the intensity and the pulse length of printing pulses.

36. The print head according to claim 31, wherein the programmable device drivers include an electronic control circuit to initiate firing of the LEDs in the array at appropriate times.

37. The print head according to claim 21, further including an optical fiber interface for delivering data to the print head.

\* \* \* \* \*